United States Patent [19]

Casciotti et al.

[11] Patent Number: 5,035,628
[45] Date of Patent: Jul. 30, 1991

[54] ELECTRICAL CONNECTOR FOR ELECTRICALLY INTERCONNECTING TWO PARALLEL SURFACES

[75] Inventors: Albert Casciotti, Hershey, Pa.; Ronald A. Dery, Winston-Salem, N.C.; Richard H. Zimmerman, Bradenton, Fla.

[73] Assignee: AMP Incorporated, Harrisburg, Pa.

[21] Appl. No.: 530,042

[22] Filed: May 29, 1990

[51] Int. Cl.$^5$ .............................................. H01R 9/09
[52] U.S. Cl. ........................................ 439/66; 439/591
[58] Field of Search ................... 439/65, 66, 67, 74, 439/77, 591, 493

[56] References Cited

U.S. PATENT DOCUMENTS

| | | | |
|---|---|---|---|
| 3,638,163 | 1/1972 | Loosme | 435/74 |
| 3,795,884 | 3/1974 | Kotaka | 439/66 |
| 3,818,414 | 6/1974 | Davies et al. | 439/66 |
| 3,924,915 | 12/1975 | Conrad | |
| 3,985,413 | 10/1976 | Evans | 439/66 |
| 4,173,381 | 11/1979 | Allmark et al. | 439/66 |
| 4,655,462 | 4/1987 | Baisells | 267/167 X |
| 4,818,241 | 4/1989 | Smoot | 439/65 |
| 4,934,942 | 6/1990 | Casciotti | 439/65 |

FOREIGN PATENT DOCUMENTS 2302429  8/1973  Fed. Rep. of Germany ........ 439/65

Primary Examiner—Neil Abrams
Assistant Examiner—Khiem Nguyen
Attorney, Agent, or Firm—Allan B. Osborne

[57] ABSTRACT

An electrical connector (10,50,50',84,84') for being positioned between parallel surfaces and electrically interconnecting conductive areas on the surfaces is disclosed. More particularly, the connector (10,50,50',84,84') includes a housing (12,52,52',86) and contact elements (14,14',14'',70,104) which are formed by wrapping a flexible, circuit carrying film (20,72) around a single canted coil spring (18) or by wrapping a flexible circuit carrying film (104) around two spaced apart canted coil springs (18).

9 Claims, 6 Drawing Sheets

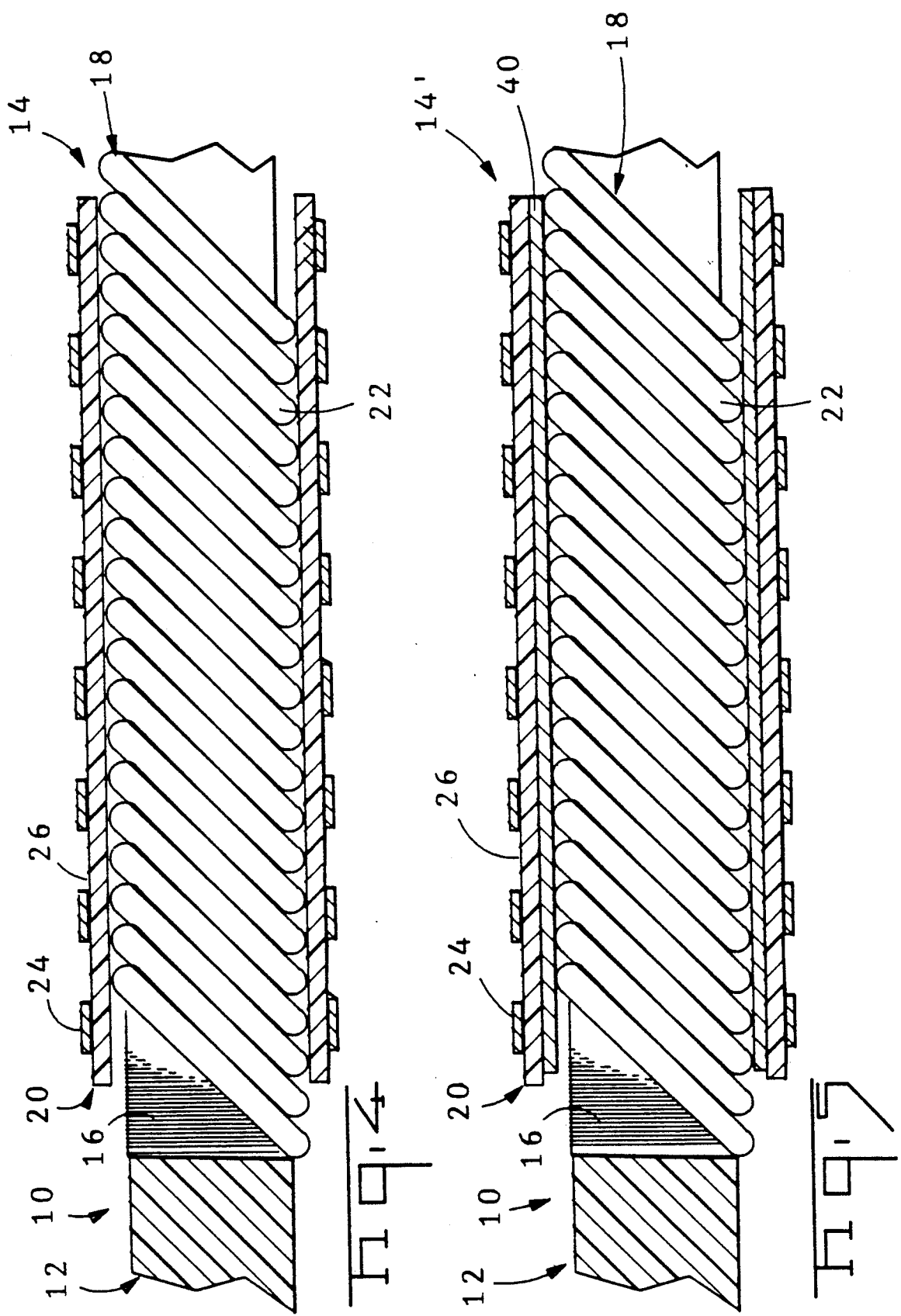

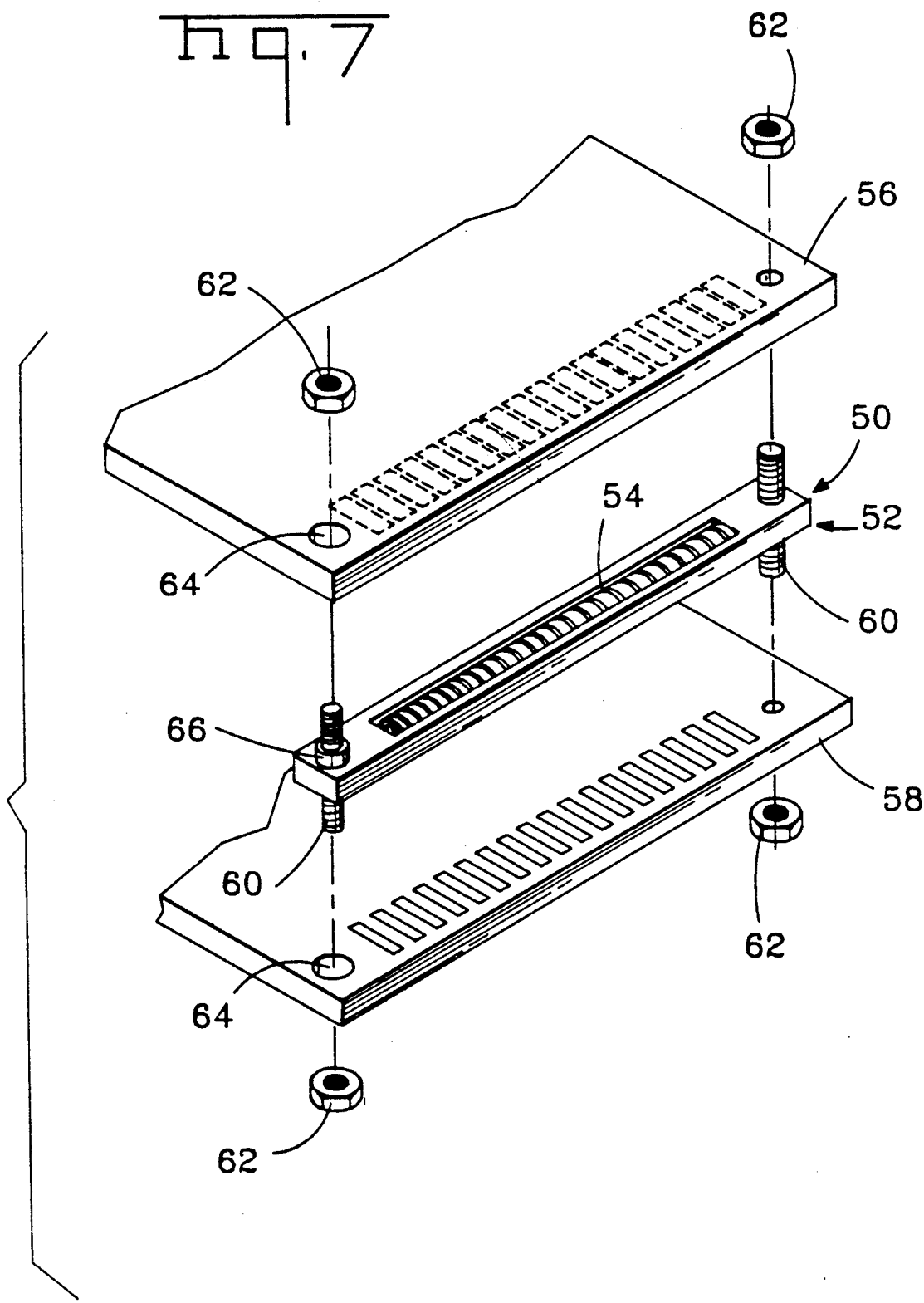

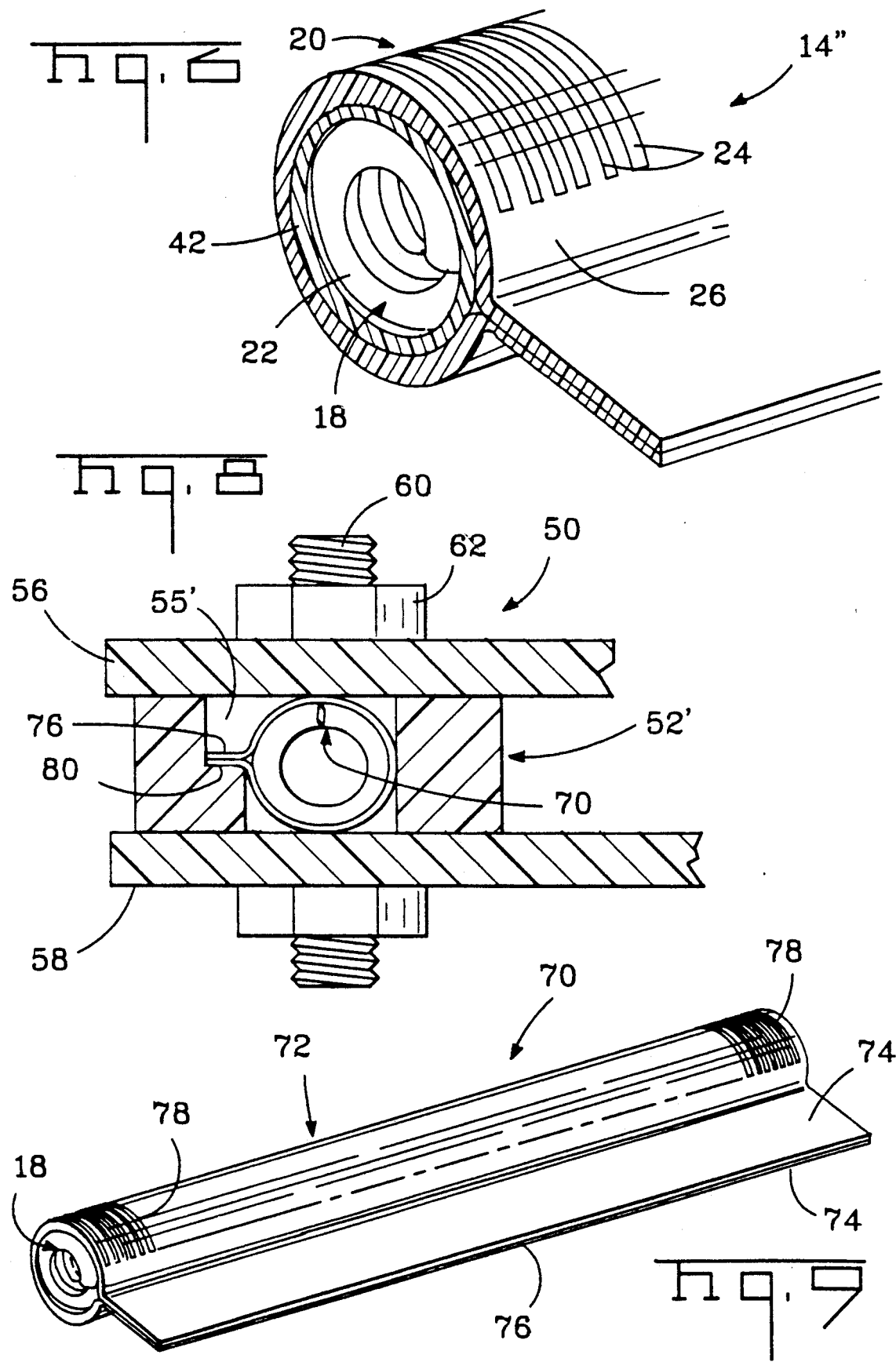

ELECTRICAL CONNECTOR FOR ELECTRICALLY INTERCONNECTING TWO PARALLEL SURFACES

FIELD OF THE INVENTION

The invention disclosed herein relates to electrical connectors, commonly referred to as "stacking" connectors, for electrically interconnecting circuits on two parallel surfaces such as printed circuit boards.

BACKGROUND OF THE INVENTION

Electrical connectors for electrically interconnecting two surfaces have been known as least as early as July, 1970 as exemplified in U.S. Pat. No. 3,638,163 to Loosme. Patentee Loosme disclosed therein a cylindrical, non-conductive body having a plurality of spaced apart conductive contacts wrapped therearound for being placed between parallel surfaces having conductive strips thereon. The strips then were electrically interconnected through the contacts.

Subsequent to Loosme, Y. Kotaka disclosed in U.S. Pat. No. 3,795,884 a connector comprising an insulating block having coil springs encapsulated therein. Each coil, electrically isolated from adjacent coils by an axial cut in one surface of the block, extended outwardly from diametric surfaces of the block to engage conductors on parallel printed circuit boards.

Thereafter, on Oct. 12, 1976, W. R. Evans issued U.S. Pat. No. 3,985,413 disclosing a connector comprising a generally cylindrical elastomeric body having a thin non-yielding flexible circuit wrapped therearound. Upon placing the connector between two parallel substrates and being compressed, corresponding conductors on the substrates will be electrically connected by the conductors on the flexible circuit.

In 1987, a P. J. Balsells issued U.S. Pat. No. 4,655,462 disclosing a coil spring with each coil being disposed at a preselected acute angle with the centerline of the spring. This type of spring, referred to as a "canted" coil spring, exerts a constant force in a loading direction normal to the centerline over a substantial range of deflection. Capitalizing on this feature, one of the co-inventors of the present invention, proposed the use of canted coil springs as biasing members in a card edge connector. It is now proposed to use canted coil springs as electrical connectors for electrically interconnecting two parallel surfaces.

SUMMARY OF THE INVENTION

According to the invention, an electrical connector is provided for electrically interconnecting parallel surfaces. The connector in one form includes a housing supporting a cylindrical contact element comprising a flexible circuit-carrying film wrapped around a canted coil spring to electrically engage and thus interconnect conductive areas on two parallel surfaces between which the connector is positioned.

DESCRIPTION OF THE DRAWINGS

FIGS. 4 and 5 are partly sectioned views showing two embodiments of contact elements used in the connector;

FIG. 6 shows yet another embodiment of the contact element;

FIG. 7 is a perspective view of another embodiment of the connector of the present invention;

FIGS. 8 and 9 are views of still another embodiment of the connector and the contact element.

DESCRIPTION OF THE INVENTION

Figure 1:
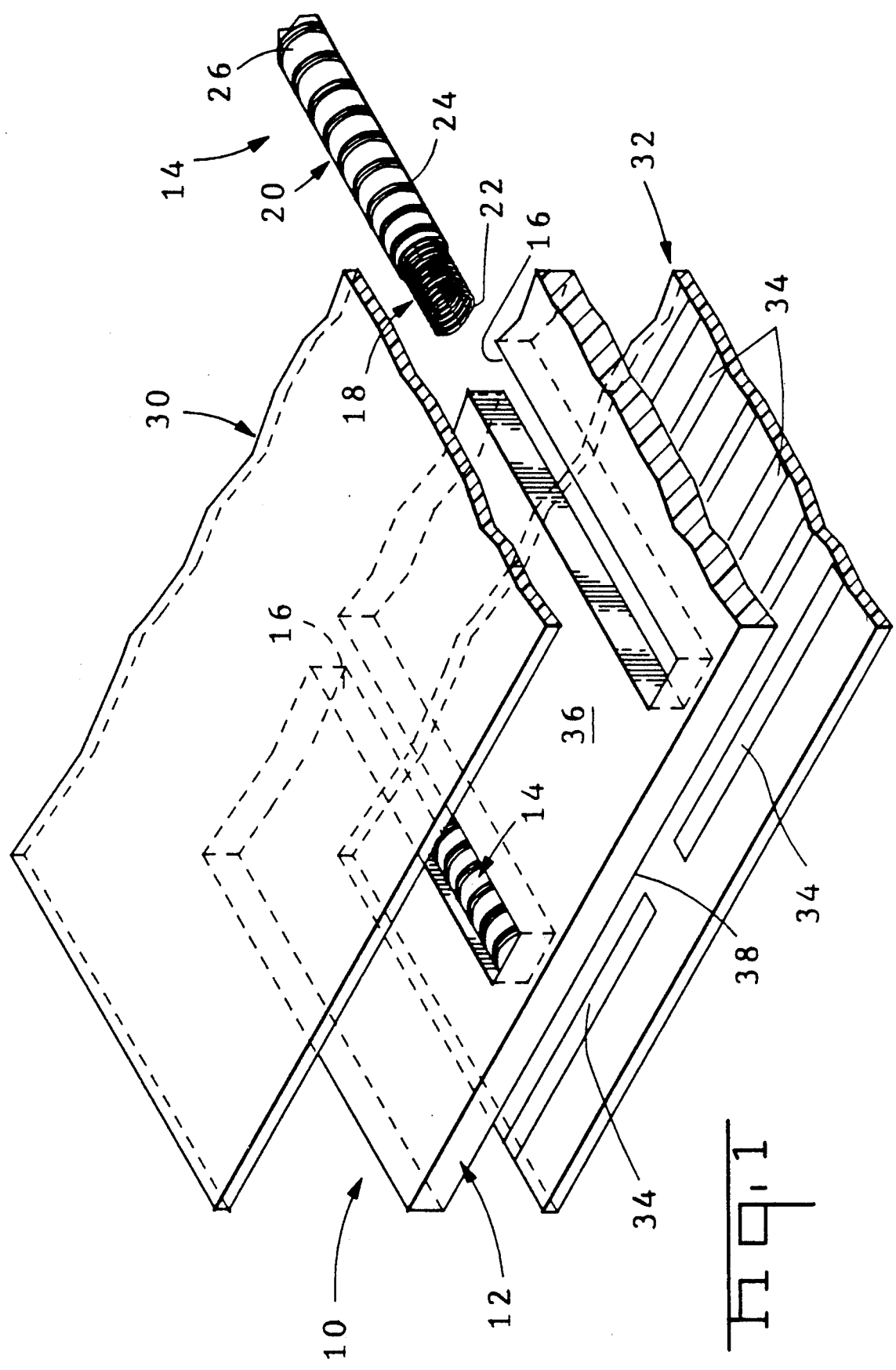
FIG. 1 is a perspective view of a connector according to one embodiment of the present invention.
Figure 2:
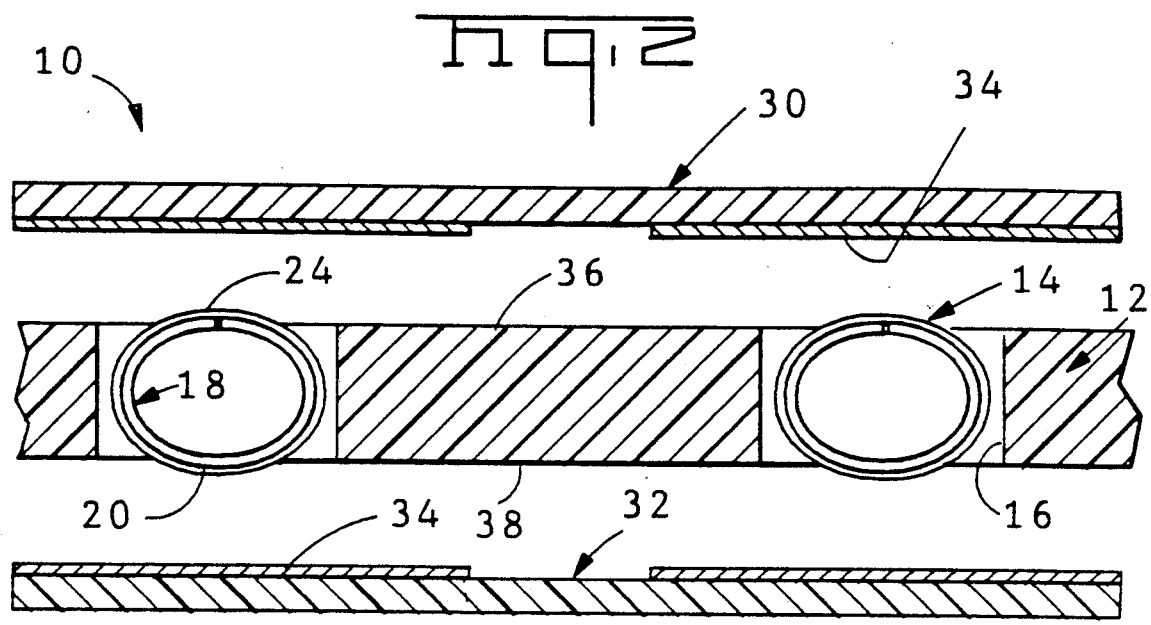
FIGS. 2 and 3 are sectional views illustrating the utility of the connector.
Figure 3:
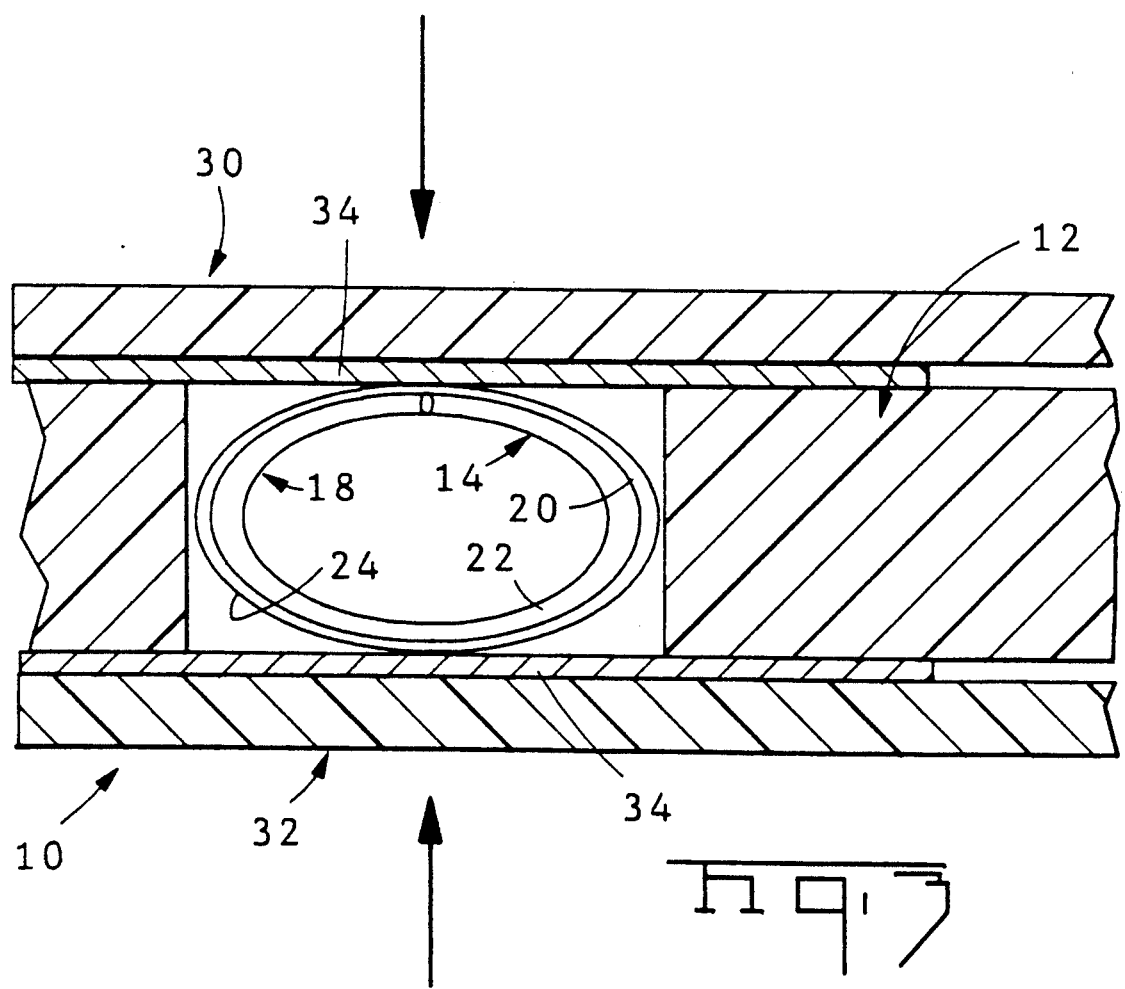

Stacking connector 10, shown in FIGS. 1, 2 and 3, include a housing 12 and elongated, generally cylindrical contact elements 14.

Housing 12 may be molded from a suitable plastics material or made from a metal and coated with an insulating film. A pre-determined number of elongated, parallel and spaced apart slots 16 in housing 12 provide spaces for receiving contact elements 14. Not shown are means for retaining elements 14 in slots 16 because such is well within the capability of those workers skilled in the art.

Contact elements 14 include two basic components: a canted coil spring 18 and flexible circuit carrying film 20. A layer of a suitable material may be placed between spring 18 and film 20 (see FIG. 5).

Canted coil springs 18, so named because of each coil 22 being at an angle relative to a horizontal axis, are made and sold by the Bal Seal Engineering Co. of Santa Ana, California.

Film 20 is a typical film available from a number of manufacturers; e.g. the 3M Company of Minneapolis, Minnesota. Circuits 24 are provided on one surface 26 of a suitable dielectric material; e.g., a polyamide. The circuits 24 are parallel and spaced apart on a predetermined pitch.

A contact element 14 is made by wrapping film 20 around spring 18. Film 20 may or may not be bonded or otherwise attached to spring 18.

FIG. 1 shows the intended use of connector 10; i.e., positioned between parallel circuit boards 30,32 to electrically interconnect circuits 34 on the respective boards 30,32.

FIG. 2 shows an end view of connector 10 between boards 30,32 and FIG. 3 shows the boards 30,32 abutting opposite surfaces 36,38 respectively of connector 10 with respective circuits 34 in electrical engagement with circuits 24 on elements 14.

As shown in FIG. 2, contact elements 14 in slots 16 stand above surfaces 36,38 of housing 12. With the boards 30,32 seated on connector 10, elements 14 are compressed so that a normal force is generated by springs 18 to push and maintain circuits 24 on film 20 against circuits 34 on respective boards 30,32.

FIG. 4 shows a segment of contact element 14 in slot 16 in housing 12. The cant of coils 22 is readily apparent. In this embodiment, film 20 is directly in contact with spring 18. Contra, the embodiment shown in FIG. 5, indicated by reference numeral 14', includes an intervening layer 40 between spring 18 and film 20. Layer 40 may be of a suitable material including a conductive material as shown to provide support and a force distribution for film 20.

FIG. 6 shows yet another embodiment of a contact element indicated by reference numeral 14". In this embodiment coil spring 18 is encapsulated within a sheath 42 of a suitable material such as silicone rubber. One method of encapsulation is by a continuous extrusion process. The silicone rubber acts to increase the normal forces generated by compression and further provides a nearly friction-free surface for the movement of coil spring 18. Another suitable material would be teflon.

FIG. 7 shows connector 50 which is another embodiment of connector 10. Connector 50 includes housing 52 and a single contact element 14 located in slot 54. As illustrated in the drawing, connector 50 may be advantageously used at the edges of circuit boards 56,58.

FIG. 7 also discloses one method of clamping boards 56,58 to connector 10 through the use of threaded studs 60 and nuts 62, which may be plastic. Polarization is provided by enlarged holes 64 at one corner of boards 56,58 and bushings 66.

FIGS. 8 and 9 illustrate an embodiment of connector 50, indicated by reference numeral 50'. In this embodiment, contact element 70 includes film 72 having free ends 74 which extend outwardly and are fastened together to form lip 76. This arrangement facilitates the wrapping and securing of film 72 around coil spring 18. Note that circuits 78 may terminate just short of free ends 74 as shown or they can continue to the free ends.

The structure of contact element 70 requires a housing 52' which is modified by providing shoulder 80 on one side of slot 55' to receive lip 76.

Figure 10:
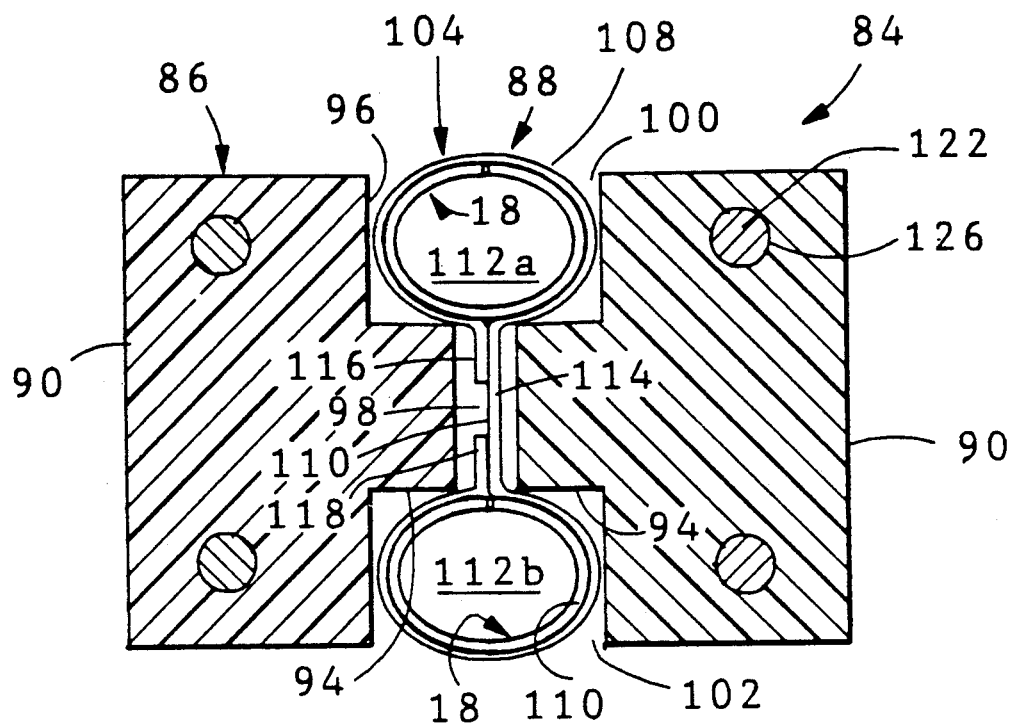
FIGS. 10 and 11 are views of two more embodiments of the connector and contact element.

FIG. 10 illustrate yet another embodiment of a stacking connector, indicated by reference numeral 84. Connector 84 includes a two piece, dielectric (or insulation-coated metal) housing 86 and a double roll contact element 88.

Housing 86 includes two sections 90 which are mirror images of each other but do not need to be. A longitudinally extending bar 94 projects outwardly from a side surface 96. The two sections 90 are removably attached together at the ends (not shown) so that bars 94 face each other and define gap 98 therebetween. Further, the two bars 94 cooperate to define, along with surfaces 96, top and bottom grooves 100,102 respectively which are in communication with each other through gap 98.

Contact element 88 includes a single strip of flexible circuit film 104 and a pair of spaced apart canted coil springs 18.

Film 104 carries circuits (not shown) on first surface 108 and may include a grounding circuit (not shown) on the opposite second surface 110.

Element 88 is formed by wrapping film 104 around the two springs 18 to form a pair of contact rolls 112a and 112b with a middle film portion 114 therebetween. Free ends 116,118, coming off springs 106, lap onto and are secured to second surface 110 of portion 114.

Connector 84 is formed by placing contact element 88 across side surface 96 of one section 90 so that middle portion 114 is crossing over bar 94 thereon and then attaching the second section 90 to complete the assembly. Alternatively, housing sections 90 may be joined by removable end caps (not shown). In this embodiment, one end cap would be removed and contact element 88 slid into place after which the end cap would be reattached.

Reference numerals 122 indicate pins which extend the holes 124 in respective sections 90. Pins 122 may be used in conjunction with end blocks (not shown) for securing sections 90 together.

Figure 11:
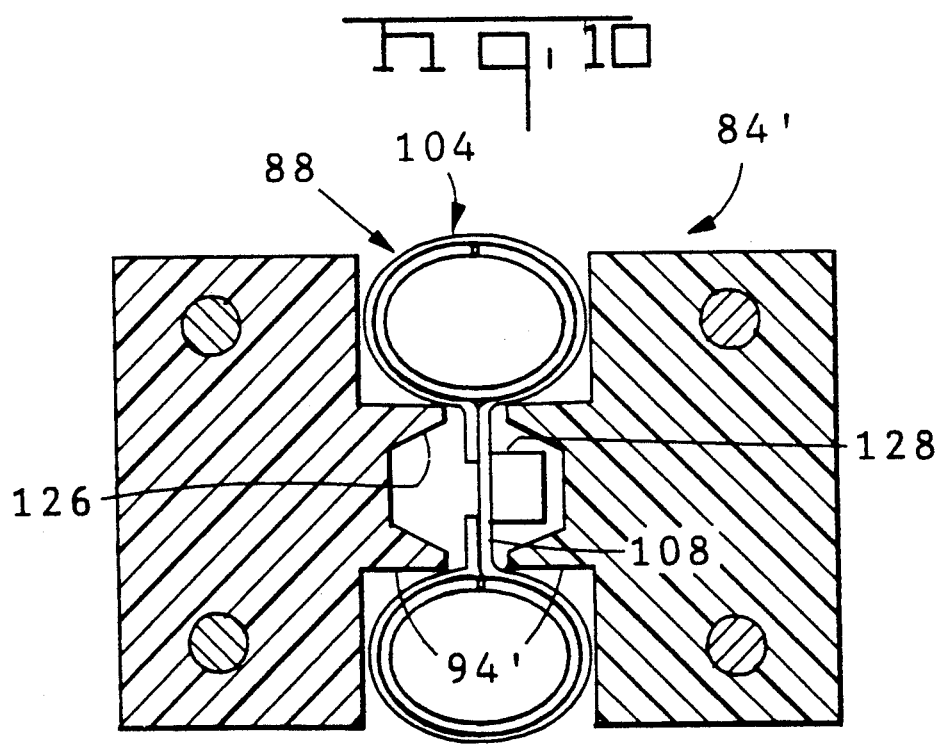

FIG. 11 illustrates connector 84' which is an alternative embodiment of connector 84. Recesses 126 are provided in the faces of bars 94' to provide space for electronic component 128 which is shown mounted on first surface 108 of film 104.

Connectors 84 and 84' are useful for interconnecting circuits to an edge of respective circuit boards as shown in FIG. 7.

As can be discerned, an electrical connector for electrically interconnecting two parallel surfaces has been disclosed. More particularly, the connector in one embodiment includes a non-conductive housing with one or more contact elements therein which are formed by wrapping a flexible circuit-carrying film around a canted coil spring. Another embodiment of the contact element discloses a secondary layer of material, either conductive or non-conductive, positioned between the film and coil spring.

We claim:

1. An electrical connector for being positioned between and for electrically interconnecting conductive areas on two spaced apart parallel surfaces, said connector comprising:
   a housing having a slot open on opposing surfaces,
   retaining means for retaining a contact element in said slot,
   a cylindrical contact element comprising a flexible circuit-carrying film wrapped around a canted coil spring with said circuits facing outwardly, said contact element being disposed in said slot with portions thereof extending outwardly from said opposing surfaces for electrically engaging and thereby electrically interconnecting conductive areas on the two parallel surfaces.

2. The electrical connector of claim 1 wherein said housing includes a plurality of spaced-apart, parallel slots and a plurality of contact elements disposed therein.

3. The electrical connector of claim 1 wherein said slot includes a shoulder on one surface and said contact element includes a longitudinal lip extending outwardly therefrom for being received on said shoulder.

4. The electrical connector of claim 3 wherein said lip is formed from free ends on said flexible circuit carrying film being joined.

5. The electrical connector of claim 1 further including a layer of material being positioned between said spring and said film.

6. The electrical connector of claim 1 wherein said spring is encapsulated within a sheath of an elastomeric material.

7. The electrical connector of claim 6 wherein said elastomeric material includes a silicon rubber.

8. An electrical connector for being positioned between parallel surfaces and for electrically interconnecting conductive areas on said parallel surfaces, said connector comprising:
   a housing formed from a pair of sections with each section having a bar extending outwardly from a surface and located inwardly from opposite corners of said surface, said sections joined together with free faces on said bars facing each other to define a gap therebetween and further defining, in cooperation with said surfaces, grooves on each side of said bars and opening outwardly therefrom; and
   a contact element having a pair of cylindrical contact rolls formed by wrapping a flexible circuit-carrying film around a pair of spaced apart canted coil springs with a middle portion of said film spanning the space therebetween, said element positioned in said housing with each roll disposed in respective grooves and said middle portion passing through said gap.

9. The electrical connector of claim 8 wherein cavities are provided in said free faces to receive electronic components which may be mounted on said middle portion of said film.

* * * * *